United States Patent [19]

Radjy et al.

[11] Patent Number: 5,231,602
[45] Date of Patent: Jul. 27, 1993

[54] APPARATUS AND METHOD FOR IMPROVING THE ENDURANCE OF FLOATING GATE DEVICES

[75] Inventors: Nader A. Radjy, Palo Alto; Michael S. Briner, San Jose, both of Calif.

[73] Assignee: Advanced Micro Devices, Inc., Sunnyvale, Calif.

[21] Appl. No.: 514,520

[22] Filed: Apr. 25, 1990

[51] Int. Cl.$^5$ .............................................. G11C 11/34
[52] U.S. Cl. ................................................... 365/185
[58] Field of Search ......................................... 365/185

[56] References Cited

U.S. PATENT DOCUMENTS 4,627,027 12/1986 Rai et al. .............................. 365/185
4,780,750 10/1988 Nolan et al. ......................... 365/185

*Primary Examiner*—Joseph A. Popek
*Attorney, Agent, or Firm*—Fliesler, Dubb, Meyer & Lovejoy

[57] ABSTRACT

An apparatus and method for improving the reliability of floating gate transistors used in memory cell applications by controlling the electric field induced across the tunnel oxide region of the floating gate transistor when discharging electrons from floating gate is provided. The invention comprises method and apparatus for varying the resistance applied to the drain electrode of the floating gate device and/or varying the voltage applied to the source electrode of the floating gate device to control the electric field in the tunnel oxide region of the floating gate device. In the preferred embodiment of the invention utilized in an EEPROM memory cell, both a method and an apparatus applying a variable resistance and a method and an apparatus applying a variable voltage are utilized simultaneously. The method and apparatus provide an optimal electric field intensity to control electron tunneling in the tunnel region of the floating gate device during discharge of electrons from the floating gate.

9 Claims, 2 Drawing Sheets

APPARATUS AND METHOD FOR IMPROVING THE ENDURANCE OF FLOATING GATE DEVICES

BACKGROUND OF THE INVENTION

Floating gate MOS transistors making use of Fowler-Nordheim tunneling of electrons are useful in a plurality of applications, particularly programmable memory devices such as EPROMs and EPALs. In typical applications, a large number of floating gate MOS transistors are formed onto a substrate in an integrated circuit thereby forming a high-density memory array. The reliability of such an array of programmable memory devices is generally dependent upon the failure of single, isolated bits in the array.

FIG. 1a shows a typical floating gate transistor 10 having source 12 and drain 14, generally formed of N+ doped regions; floating gate 15, generally formed of a group I polysilicon; control gate 16, generally formed of a group II polysilicon; and dielectric silicon oxide ($SiO_2$) layer 18.

To be useful, the floating gate transistor 10 is charged and discharged in accordance with its use in the particular application.

In order to charge or program a particular floating gate transistor, a programming voltage $V_{pp}$, on the order of 5–20 volts, is applied to the control gate electrode 16, while source 12 and drain 14 are held at ground or allowed to float. Upon applying $V_{pp}$ to the control gate 16, capacitive coupling between the control gate 16 and the floating gate 15 causes the floating gate 15 to acquire electrons from the drain region 14 through the process of Fowler-Nordheim tunneling. When $V_{pp}$ is removed, the floating gate 15 assumes a negative voltage due to the presence of the trapped electrons on the floating gate 15.

Discharge of electrons from the floating gate is generally accomplished by grounding the control gate 16, and applying the programming voltage $V_{pp}$ to the drain 14 while allowing the source 12 to float.

In a typical high-density memory array, a certain percentage of floating gate transistors used in the memory cells will exhibit atypical charge/discharge characteristics. These atypical cells comprise "weak" bits in the memory array. An atypical cell is defined as a cell which, after a number of charge/discharge cycles, fails to charge/discharge properly because of a breakdown of the tunnel dielectric caused by excessive electron tunneling. A typical bit performs charge/discharge functions for the period of time expected by the hardware designer, taking into account the particular materials used and the parameters of the floating gate transistor, such as oxide thickness, length, width, and implantation concentration. In general, the endurance of a typical bit in the array is generally orders of magnitude better than those of the weak bit.

The endurance of an oxide layer depends on the quality of the $SiO_2$ tunneling dielectric, which is a function of the amount of charge which can be made to pass through the dielectric before breakdown of the floating gate occurs. This is normally referred to as "fluence" or $Q_{BD}$. When the term "endurance" is used with respect to a memory array, the term refers to the length of time the particular array will function before a failure in a "weak" bit occurs.

A failure of any particular weak bit in a memory array thus reduces the endurance of the array. It is then desirable to reduce the failure rate of weak bits within an array to improve the overall endurance of the memory chip.

It is thus an object of the invention to improve the reliability of a floating gate transistor.

It is a further object of the invention to improve the endurance of a memory array using floating gate transistors.

It is another object of the present invention to provide the above objects in an electrically erasable programmable memory cell.

It is a further object of the invention to improve the endurance of a floating gate transistor by controlling the tunneling current through the dielectric layer of the transistor during discharge of the floating gate.

It is a further object of the invention to provide the above objects in a floating gate transistor configuration which optimizes the electric field potential at the tunnel region of the dielectric insulating layer during discharge of the floating gate.

SUMMARY OF THE INVENTION

The invention comprises an apparatus and method for improving the endurance and reliability of a floating gate transistor often used in memory applications. Specifically, a method and means are provided for controlling the electric field induced across the tunnel oxide region of a floating gate memory transistor when discharging electrons from the floating gate. By controlling the electric filed across the tunnel region of a particular floating gate apparatus during the discharge of electrons from the floating gate, the tunneling current through the oxide region is optimized for the particular gate oxide thickness of individual floating gate transistors. In large memory arrays wherein a multitude of floating gate devices are formed on a particular substrate, those devices with thinner-than-expected oxide regions in localized areas resulting in high voltage potentials during discharge, and thus earlier floating gate breakdown under previous conditions, have been better optimized for higher localized electric fields during discharge.

The apparatus of the invention can utilize a variable resistance coupled to the drain electrode of the floating gate device or a variable voltage source coupled to the source electrode. In the preferred embodiment of the invention wherein the invention is utilized in an EEPROM memory cell, both a variable resistance means and variable voltage source are utilized simultaneously. In such a preferred embodiment, the resistance means is coupled to the drain electrode of the select transistor of the EEPROM, while the variable voltage source is coupled to the source electrode of the floating gate transistor.

BRIEF DESCRIPTION OF THE DRAWINGS

The invention will be described with respect to the specific embodiments thereof. Other objects, embodiments, and features of the invention will be apparent from a reading of the detailed description in conjunction with the drawings.

DESCRIPTION OF THE PREFERRED EMBODIMENTS

The subject matter of the invention will be described herein with reference to use of the floating gate transistor in an electrically erasable programmable read-only memory (E²PROM) cell. However, upon reading of the detailed description of the invention, it will be apparent to a person of ordinary skill that the invention is applicable in numerous applications wherein a floating gate transistor using Fowler-Nordheim tunneling is used, for example EPALs, EPLDs and Flash-EEPROMs.

It has been determined that $Q_{BD}$ is typically much lower during the discharge of electrons from the floating gate into the doped drain region than it is during the charging process. Thus, the amount of charge which can be made to pass through the dielectric before breakdown of the tunneling dielectric occurs is lower on discharge than on charge. Further, the charge on the floating gate 15 is related to the external cell threshold voltage, $V_T$.

The probable cause of single floating gate transistor failures in atypical cells in a typical memory array arise from:

(1) a cell with a higher-than-average ratio of control gate—floating gate capacitance over the total capacitance or ($C_g/C_t$); or (2) a cell with a lower-than-average ratio of drain—floating gate capacitance over the total capacitance of the cell ($C_d/C_t$): or (3) a cell with a thinner-than-typical tunnel dielectric thickness (caused by local variations in cell oxide thickness during formation of the chip). These characteristics give rise to a higher-than-typical electric field across the tunneling dielectric during charge/discharge cycling.

Figure 1A:
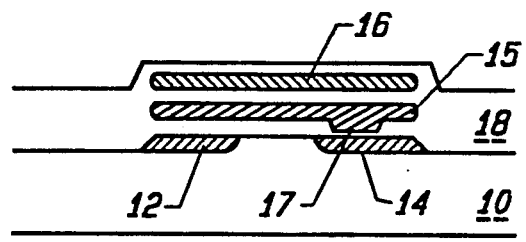
FIG. 1a is a schematic diagram of a configuration of a floating gate transistor.
Figure 1B:
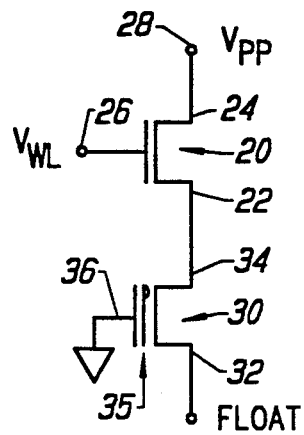
FIG. 1b is a schematic diagram showing a floating gate transistor in an electrically erasable, programmable, read only memory ($E^2PROM$) demonstrating a prior-art method for discharging a floating gate transistor in an $E^2PROM$.

With reference to FIG. 1b, a floating gate transistor 30 is shown in a typical application—an E²PROM cell. The E²PROM cell generally comprises the floating gate transistor 30 with source 32, drain 34, and control gate 36, and a MOS select transistor 20 having source 22, drain 24, and gate 26.

For purposes of this discussion and the examples shown herein, the floating gate transistor 30 is assumed to have an intrinsic threshold voltage of $V_{TO}=0$. The charged threshold value $V_{TC}$ is, therefore, greater than zero and the discharged threshold value $V_{TD}$ is less than zero, due to the presence and absence, respectively, of charge on the floating gate. In practice, an intrinsic $V_{TO}=0$ is not essential; the intrinsic $V_T$ of the floating gate can be either positive or negative.

FIG. 1b demonstrates the prior-art method for discharging the electrons stored on the floating gate 35 of a floating gate transistor 30 when used in an E²PROM cell. A program voltage $V_{pp}$ on the order of 15–20 volts is applied to the drain electrode of select transistor 20. Typically, gate 26 of the select transistor 20 is generally coupled to a word line (not shown) of an array of E²PROM cells. A voltage $V_{wl}$, greater than or equal to the programming voltage $V_{pp}$, is applied to the gate 26 of the select transistor via the word line rendering select transistor 20 conductive. The gate 36 of floating gate transistor 30 is held at ground while the source 32 of floating gate transistor 30 is allowed to float or also held at ground.

Upon application of $V_{pp}$ and $V_{WL}$, the electrons will be discharged from the floating gate transistor 30. In the case of an atypical cell, discharge of the floating gate occurs more quickly than in typical cells. Thus, while there is no need for the continued application of $V_{pp}$ to discharge the floating gate 35, because the duration of application of this voltage is standard for both typical and atypical cells, the application of $V_{pp}$ will continue.

If $V_s$ floats, then atypical cells will, after the discharge pulse $V_{pp}$ has been applied for a set time, exhibit a more negative $V_{TD}$ (or greater $|V_{TD}|$). In such situations, Fowler-Nordheim tunneling across the tunnel dielectric will continue until such time as either (1) the discharge pulse is terminated, or (2) the floating gate voltage is sufficiently positive that tunneling across the tunnel dielectric either ceases or becomes negligibly small. This continued application of $V_{pp}$ results in degradation of the floating gate eventually leading to a failure of the "weak bit".

Figure 2A:
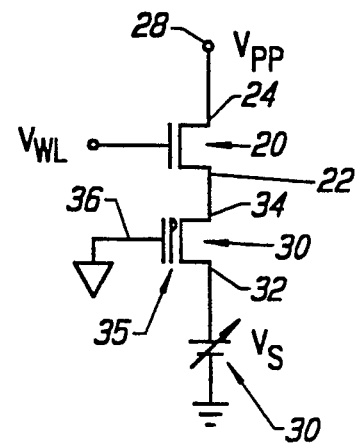
FIG. 2a is a schematic diagram showing a first embodiment of the present invention in an E²PROM cell.

FIG. 2a shows a first embodiment of the present invention wherein a floating gate transistor 30 is used in an E²PROM cell. The E²PROM cell is essentially the same as the E²PROM cell shown in FIG. 1b, however, an adjustable voltage source $V_s$ is coupled to the source of the floating gate transistor 30.

The $V_T$ of each cell is related to the amount of charge on the floating gate as discussed above. Coupling voltage source $V_s$ to source 32 of the floating gate transistor 30 allows one to lower the electric field across the tunneling region, and lower the $|V_{TD}|$ for atypical cells.

In the region where potential applied by voltage source $V_s$ is in the range of $0 \leq V_s < 5$ volts, the source potential controls the linear turn-on point of the E²PROM cell which in turn controls the voltage on the drain tunnel region. (FIG. 2b.)

Figure 2B:
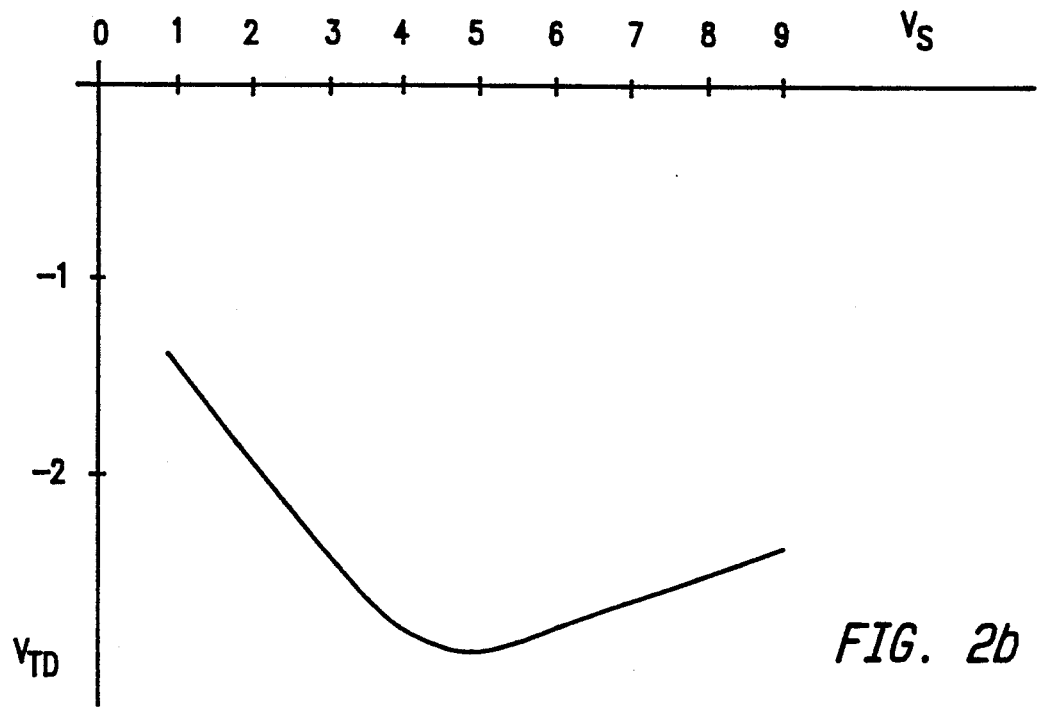
FIG. 2b is a graph representing the relationship between the cell threshold voltage ($V_{TD}$) on discharge and the voltage potential applied to the source of the floating gate ($V_s$).

The effect of controlling voltage source $V_s$ during discharge is shown in FIG. 2b. FIG. 2b is a graph representing the relationship of $V_{TD}$ versus $V_s$. By controlling the linear turn-on point of the E²PROM for atypical cells, $|V_{TD}|$, is reduced because less tunneling occurs due to the lower electric field caused by using $V_s$ control.

In effect, the source voltage $V_s$ is capacitatively coupled onto the floating gate 35 of the floating gate transistor 30. Both floating gate transistor 30 and select transistor 20 have an effective resistance associated with them. As $V_s$ at source 32 is increased, the resistance of the total E²PROM cell increases and thus the voltage appearing on the drain 34 of floating gate transistor 30 also increases. An increase in $V_s$ leads to a higher tunneling field and more negative discharge threshold voltages ($V_{TD}$). For $V_s > 5$ volts, capacitive coupling of the source voltage becomes significant and the discharge threshold voltage ($V_{TD}$) of the cell begins to increase.

Figure 3A:
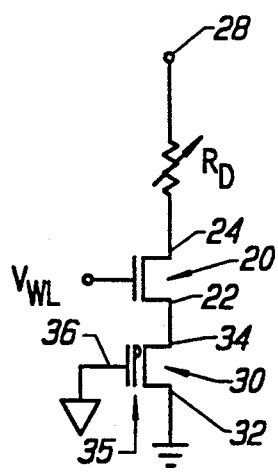
FIG. 3a shows a second embodiment of the present invention in an E²PROM.

FIG. 3a shows a second embodiment of the present invention for controlling tunneling current through the oxide layer of a floating gate transistor during discharge. FIG. 3a shows a variable resistance $R_D$ coupled in series to the drain 24 of the select transistor 20 in an E²PROM cell. Applying a resistance in series with the floating gate transistor drain allows for control of current at drain 34 and through floating gate transistor 30. In this manner, control of the tunneling current through the oxide layer in the tunneling region 37 of the floating gate transistor 30 is achieved. In the embodiment shown in FIG. 3a, the variable resistance $R_D$ can comprise, for example, an external resistance or may be fabricated on the same substrate as the E²PROM cell. Variable resistance $R_D$ could also, for example, comprise the select transistor 20. It should also be noted that, while FIG. 3a shows the source 32 of floating gate transistor 30 coupled directly to ground, in practice the source 32 may be at virtual ground, and in fact coupled to high capacitive loads which act as a virtual ground.

Figure 3B:
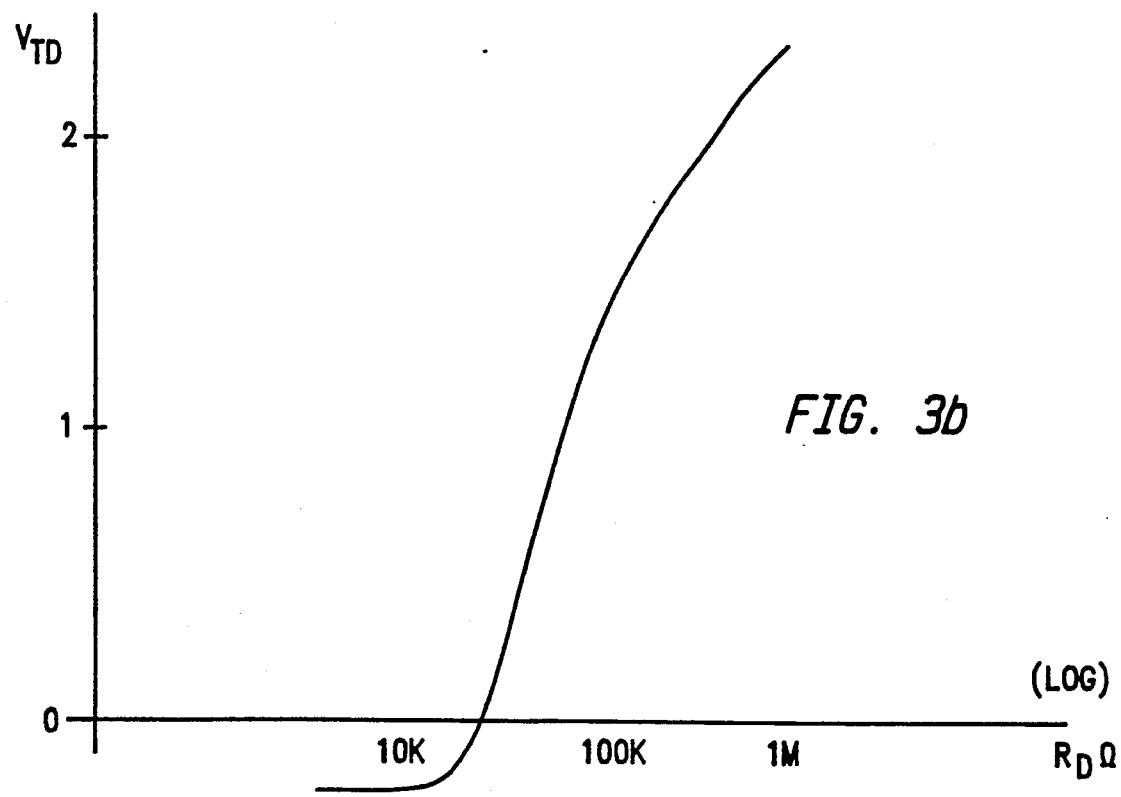
FIG. 3b is a graph representing the relationship between the cell threshold voltage ($V_{TD}$) on discharge and a resistance ($R_D$) applied at the drain of a select transistor in an E²PROM.

FIG. 3b graphically shows the relationship between the variable resistance $R_D$ and the cell threshold voltage on discharge $V_{td}$ obtained for the following values: $R_D = 10K\Omega$ to $1M\Omega$; $V_{pp} = 14.5$ volts applied for 1200 $\mu s$; $V_{wl} = 20$ volts; and $V_s$ at ground.

Figure 4:
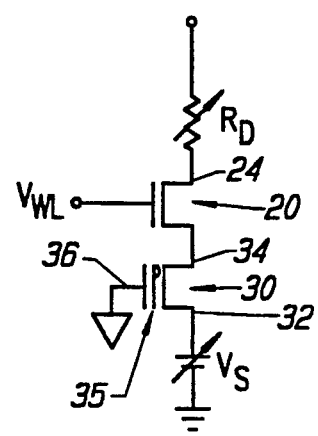
FIG. 4 shows the preferred embodiment of the present invention in an E²PROM.

FIG. 4 shows the preferred embodiment for implementing the present invention. Both a variable resistance $R_D$ coupled to the drain 24 of the select transistor 20 and variable voltage source $V_s$ are coupled to the source 32 of the floating gate transistor 30. By controlling both source voltage $V_s$ and drain current $R_D$, the tunneling current at the tunnel region of the dielectric layer of a floating gate transistor 30 can be optimized. Experimental results using a varying resistance $R_D$ and varying $V_s$ between 0 and 5 volts on a population of E²PROM cells which had seen about 200 charge/discharge cycles yielded optimal values for $R_D = 100$ Kohms and for $V_s = 5$ volts to obtain the least standard deviation amongst $|V_{TD}|$ for the E²PROM cells. The triple standard deviation of $V_{TD}$ for all cells in the array using the aforesaid optimal values was 0.75 volts.

Using the source bias and series resistance coupling method of the proposed invention, $|V_{TD}|$ for atypical cells can be reduced, thus causing the floating device to conduct earlier and the field across the tunneling dielectric to collapse.

Thus, under the proposed method, an atypical cell (or "weak" bit) will have a cell threshold voltage, on discharge ($V_{TD}$) which is much closer to that of typical cells because the maximum field across the tunneling oxide regions of the atypical cells is reduced. This leads to a higher endurance for each atypical floating gate transistor with thinner-than-average SiO2 layers and such atypical transistors disposed within a typical memory array will not fail as quickly as with prior-art discharge methods.

Furthermore, once the floating gate becomes discharged, the transistor turns "on" thereby collapsing the electric field across the gate "automatically". Effectively, the total tunneling current through the oxide layer is "self limited" by the floating gate transistor's lower $|V_{TD}|$.

The invention has been described with respect to particular embodiments thereof. Numerous variations are possible as will be apparent to a person of ordinary skill in the art after reading the present specification. For example, though the invention has been particularly described with reference to an E²PROM cell, those skilled in the art will recognize that the invention is applicable to all particular applications using floating gate transistors operating with Fowler-Nordheim tunneling through an oxide region. This variation and others are intended to be within the scope of the present invention as defined by the claims.

What is claimed is:

1. A self-limited programming circuit, comprising:
a first MOS transistor having a floating gate, oxide layer, source electrode, and drain electrode; and
means for regulating the electric field potential across said oxide layer, comprising a variable resistor coupled to said drain electrode and means for controlling the voltage applied to said source electrode of said first MOS transistor, wherein said means for controlling and said variable resistor are set to optimize the electric field potential across the oxide layer during discharge of electrons from said floating gate to minimize current through the oxide layer.

2. The self limited programming circuit of claim 1 wherein said means for controlling the voltage applied to said source electrode comprises a variable voltage source.

3. In a semiconductor memory array:
(a) a plurality of memory cells each of said memory cells comprising a MOS transistor having a floating gate, oxide layer, source electrode and drain electrode, and
(b) at least one self-limited programming circuit for reducing the failure rate of said plurality of memory cells in said array, said self-limited programming circuit including
means for controlling the voltage applied to said source electrode of at least one of said MOS transistors to regulate an electric field potential across said oxide layer during the discharge of electrons from said floating gate to minimize the quantity of current through the oxide layer of said first MOS transistor during the discharge of electrons from the floating gate.

4. The self-limited programming circuit as claimed in claim 3, further including resistance means for controlling the current applied to said drain electrode of said at least one MOS transistor.

5. The self-limited programming circuit as claimed in claim 3 wherein said means for controlling comprises a variable voltage source coupled to said source electrode of said at least one MOS transistor.

6. An electrically erasable programmable read only memory (E²PROM) cell, said E²PROM cell having a select transistor including source electrode and drain electrode, and a MOS transistor including a floating gate, oxide layer, source electrode, and drain electrode, comprising:
variable resistance means coupled to said drain electrode of said select transistor for selectively regulating current through said oxide layer of said MOS transistor; and
variable voltage source means coupled to said source electrode of said MOS transistor for selectively regulating the voltage applied to said source electrode of said MOS transistor; wherein said variable resistance means and variable voltage source means operate to minimize the electric field potential across said oxide layer during discharge of electrons from said floating gate.

7. A method for improving the endurance of a memory array having a plurality of floating gate MOS transistors, each MOS transistor having a gate electrode, a floating gate, source and drain electrodes, and an oxide layer separating said source and drain electrodes from said floating gate, said MOS transistors for storing data in the form of electrons on the floating gates thereof, the method comprising:

(a) discharging electrons from the floating gates by applying a first voltage to the drain electrodes of the plurality of floating gate MOS transistors and a second voltage to the gate electrodes of the floating gate MOS transistors; and (b) simultaneously controlling an electric field potential of each such MOS transistor during the discharge thereof by controlling a quantity of a variable resistance in series with the drain electrode of each MOS transistor.

8. The method for improving the endurance of a memory array as claimed in the claim 7 wherein said step (b) is performed by controlling a variable voltage applied to the source of each said MOS transistor.

9. The method for improving the endurance of a memory array as claimed in claim 7 wherein said step (b) is performed by simultaneously applying a variable resistance to the drain electrode of each MOS transistor; and controlling a variable voltage applied to the source of each MOS transistor.

* * * * *